United States Patent
Lashkarian et al.

(10) Patent No.: US 10,122,391 B2
(45) Date of Patent: Nov. 6, 2018

(54) RADIO FREQUENCY SYSTEMS AND METHODS FOR POLAR PHASE DISTORTION CALIBRATION

(71) Applicant: Apple Inc., Cupertino, CA (US)

(72) Inventors: Navid Lashkarian, Pleasanton, CA (US); Ehsan Adabi, Mountain View, CA (US); Albert Chia-Wen Jerng, Woodside, CA (US); Arya Behzad, Los Altos, CA (US); Ali Parsa, Saratoga, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 14/870,768

(22) Filed: Sep. 30, 2015

(65) Prior Publication Data
US 2017/0093444 A1 Mar. 30, 2017

(51) Int. Cl.
| | |
|---|---|
| H04B 1/04 | (2006.01) |
| H04L 27/36 | (2006.01) |
| H03F 1/32 | (2006.01) |
| H03C 5/00 | (2006.01) |

(52) U.S. Cl.
CPC ............ *H04B 1/0475* (2013.01); *H03C 5/00* (2013.01); *H03F 1/3241* (2013.01); *H04B 1/0483* (2013.01); *H04L 27/36* (2013.01); *H04L 27/361* (2013.01); *H04L 27/368* (2013.01); *H04B 2001/0425* (2013.01)

(58) Field of Classification Search
CPC .......... H04B 1/0475; H04B 2001/0425; H04L 27/36; H04L 27/367; H04L 27/368
See application file for complete search history.

(56) References Cited

U.S. PATENT DOCUMENTS

| | | | |
|---|---|---|---|
| 6,580,320 B1 * | 6/2003 | Kenington | H03F 1/3241 330/124 R |
| 7,064,852 B2 | 6/2006 | Mitsudomi et al. | |
| 7,346,122 B1 | 3/2008 | Cao | |
| 7,817,787 B2 | 10/2010 | Waheed et al. | |
| 7,860,188 B2 | 12/2010 | Jensen | |
| 8,150,336 B2 | 4/2012 | Waheed et al. | |
| 9,020,027 B2 | 4/2015 | Staszewski et al. | |
| 9,438,281 B2 * | 9/2016 | Hirai | H04B 1/0475 |
| 2005/0195919 A1 * | 9/2005 | Cova | H03F 1/3258 375/297 |

(Continued)

FOREIGN PATENT DOCUMENTS

KR 10-2011-0068701 A 6/2011

OTHER PUBLICATIONS

Park et al. "Adaptive Digital Predistortion Linearization of Frequency Multipliers", IEEE Transactions on Microwave Theory and Techniques, 2003, vol. 51, Issue 12, pp. 2516-2522.*

(Continued)

*Primary Examiner* — David B. Lugo
(74) *Attorney, Agent, or Firm* — Fletcher Yoder PC

(57) ABSTRACT

Systems and method provided herein relate to reducing distortion of signals introduced by components on a phase path of a radio frequency system polar architecture. To reduce phase path distortion, a pre-distortion is introduced prior to a distortion caused by the components on the phase path. The pre-distortion in conjunction with the component distortion results in a transmission signal that forms its expected shape.

29 Claims, 9 Drawing Sheets

(56) References Cited

U.S. PATENT DOCUMENTS

| | | | |
|---|---|---|---|
| 2005/0210354 A1* | 9/2005 | Kurokami | H03F 1/3241 |
| | | | 714/747 |
| 2006/0178120 A1* | 8/2006 | Puma | H03F 1/3241 |
| | | | 455/114.3 |
| 2007/0290749 A1* | 12/2007 | Woo | H03C 5/00 |
| | | | 330/149 |
| 2007/0298734 A1 | 12/2007 | Woo et al. | |
| 2008/0133982 A1* | 6/2008 | Rawlins | H03F 1/0211 |
| | | | 714/699 |
| 2009/0291650 A1* | 11/2009 | Singerl | H03F 1/3247 |
| | | | 455/114.3 |
| 2010/0081397 A1* | 4/2010 | Lee | H03F 1/3241 |
| | | | 455/108 |
| 2010/0167798 A1 | 7/2010 | Kawai et al. | |
| 2012/0128099 A1* | 5/2012 | Morris | H03F 1/3247 |
| | | | 375/297 |
| 2014/0211882 A1* | 7/2014 | Zhao | H04L 27/368 |
| | | | 375/296 |

OTHER PUBLICATIONS

Nedrich, Matt, "An Introduction to Gradient Descent and Linear Regression", https://spin.atomicobject.com/2014/06/24/gradient-descent-linear-regression/, Jun. 24, 2014.*
International Search Report and Written Opinion for PCT Application No. PCT/US2016/048202 dated Nov. 14, 2016, 14 pgs.
Korean Office Action for Korean Application No. 10-2018-7005945 dated Apr. 19, 2018; 7 pgs.

* cited by examiner

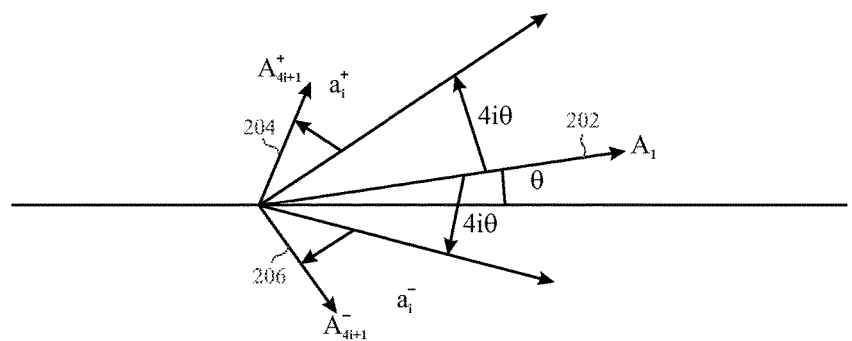
FIG. 9
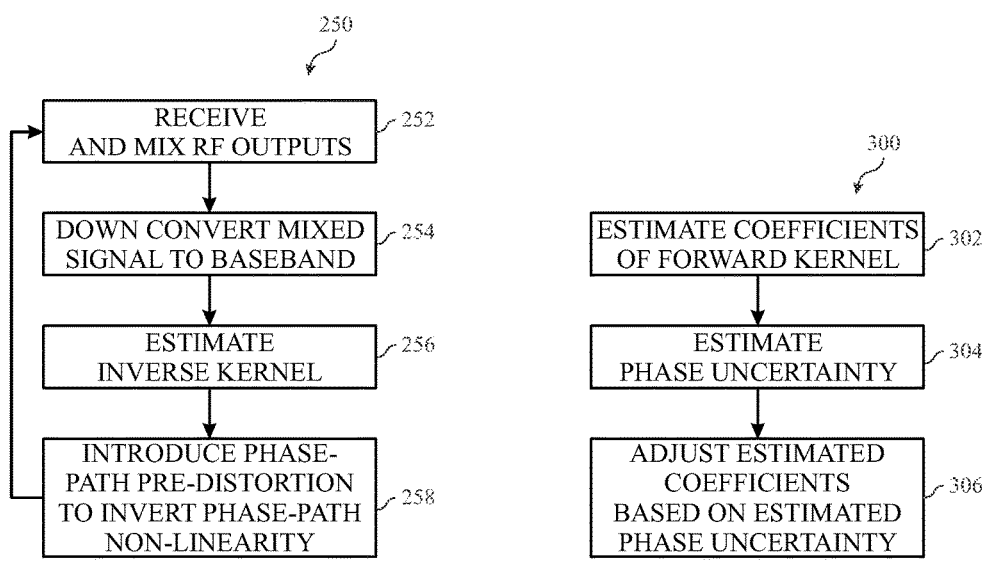
FIG. 10
FIG. 12

RADIO FREQUENCY SYSTEMS AND METHODS FOR POLAR PHASE DISTORTION CALIBRATION

BACKGROUND

The present disclosure relates generally to radio frequency systems and, more particularly, to controlling distortion produced by polar architecture radio frequency system.

This section is intended to introduce the reader to various aspects of art that may be related to various aspects of the present techniques, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

Many electronic devices may include a radio frequency system to facilitate wireless communication of data with other electronic devices and/or a network. The radio frequency system may include a transceiver that receives a digital representation of data as a digital electrical signal and generates an analog representation of the data as an analog electrical signal. A power amplifier may then amplify the analog electrical signal to a desired output power for wireless transmittance via an antenna at a desired radio frequency.

To enhance the efficiency of the wireless transmission, a polar architecture may be used, where a modulated signal is decompressed into amplitude modulated (AM) and phase modulated (PM) signals. The AM and PM signals may each be processed through separate AM and PM paths, respectively.

Unfortunately, because there are two separate paths (the AM and PM paths), additional distortion may be present over Cartesian architectures. For example, in Cartesian architectures, distortion may be introduced when the modulated signal has a high amplitude. In such a scenario, there could be both amplitude distortion (AM-to-AM distortion) and phase distortion (AM-to-PM distortion). In contrast, in a polar architecture having two separate amplitude (AM) and phase (PM) paths, additional distortions may occur in addition to the conventional distortions found in the Cartesian architectures (e.g., AM-to-AM and AM-to-PM distortions). For example, polar architectures may include PM-to-AM distortions and PM-to-PM distortions.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

The present disclosure generally relates to improving performance of polar architecture radio frequency systems, by reducing unwanted tonal distortions. Generally, the radio frequency system may wirelessly communicate data with other electronic devices and/or a network by modulating radio waves at assigned transmission frequencies, based on an analog representation of the data (e.g., an analog electrical signal). In polar architectures, the modulated signal may be decomposed into amplitude modulated (AM) and phase modulated (PM), which may result in additional phase path distortion. Generally speaking, to reduce this phase path distortion, the signals may be pre-distorted, such that the signals return to their original shape after the phase path distortion occurs. More specifically, a calibration feedback loop may down-convert a processed signal to baseband. The down-converted signal may be provided to calibration logic (e.g., hardware circuitry of the radio frequency system) that calculates an inverse kernel for the phase path distortion of the radio frequency system. Using the inverse kernel, pre-distortion logic (e.g., hardware circuitry of the radio frequency system) may pre-distort signals, inverting the phase path nonlinearity. Accordingly, the phase path distortions may be reduced, resulting in a more efficient and accurate transmission by the radio frequency system.

BRIEF DESCRIPTION OF THE DRAWINGS

Various aspects of this disclosure may be better understood upon reading the following detailed description and upon reference to the drawings in which:

FIG. 9 is a block diagram illustrating the impact of the phase-path distortion of the radio frequency system of FIG. 5, in accordance with an embodiment;

FIG. 10 is a flowchart illustrating a process for reducing phase path modulation, in accordance with an embodiment;

FIG. 12 is a flowchart that illustrates a process for estimating and correcting for phase uncertainty, in accordance with an embodiment.

DETAILED DESCRIPTION

Figure 1:
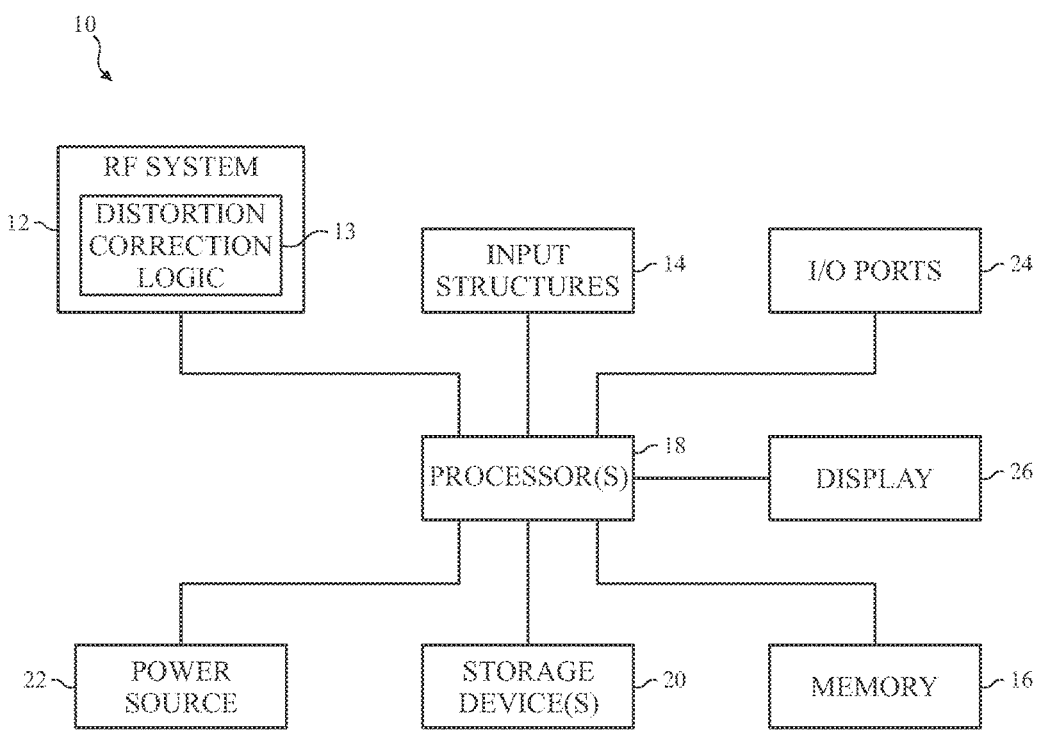
FIG. 1 is a block diagram illustrating an electronic device that includes a radio frequency system with a phase path pre-distortion system, in accordance with an embodiment.

One or more specific embodiments of the present disclosure will be described below. These described embodiments are only examples of the presently disclosed techniques. Additionally, in an effort to provide a concise description of these embodiments, all features of an actual implementation may not be described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but may nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

As mentioned above, an electronic device may include a radio frequency system to facilitate wirelessly communication of data with another electronic device and/or a network. More specifically, the radio frequency system may modulate radio waves at a desired radio frequency, such as an assigned one or more resource blocks in a channel, to enable the electronic device to communicate via a personal area network (e.g., Bluetooth network), a local area network (e.g., an 802.11x Wi-Fi network), and/or a wide area network (e.g., a 4G or LTE cellular network). In other words, the radio frequency systems may utilize various wireless communication protocols to facilitate communication of data.

Nevertheless, radio frequency systems may generally be operationally similar regardless of the wireless communication protocol used. For example, to transmit data, processing circuitry may generate a digital representation of the data as a digital electrical signal and a transceiver (e.g., a transmitter and/or a receiver) may then convert the digital electrical signal into one or more analog electrical signals. The analog electrical signal may then be amplified by a power amplifier, filtered by one or more filters, and transmitted by an antenna.

However, along with the data, the radio frequency system may also transmit spurious emissions. As used herein, "spurious emissions" are intended to describe wireless signal transmission at frequencies other than a desired transmission frequency. In some embodiments, the spurious emissions may be the result of noise introduced into the analog electrical signal by the transceiver and/or the power amplifier. For example, the transceiver may introduce noise as a result of digital signal modulation or analog impairments in the modulator, mixer, or driver amplifier. Additionally, the power amplifier may introduce noise as a result of non-linearities. For example, in polar architectures, the modulated signal may be decomposed into amplitude modulated (AM) and phase modulated (PM), which may result in additional phase path distortion.

To reduce this phase path distortion, the base band signals may be pre-distorted in a manner that results in the phase path distortion returning the signals to their original shape. More specifically, a calibration feedback loop may down-convert a processed signal to baseband. The down-converted signal may be provided to calibration logic (e.g., hardware circuitry of the radio frequency system) that calculates an inverse kernel for the phase path distortion of the radio frequency system. Using the inverse kernel, pre-distortion logic (e.g., hardware circuitry of the radio frequency system) may pre-distort signals, inverting the phase path nonlinearity. Accordingly, the phase path distortions may be reduced, resulting in a more efficient and accurate transmission by the radio frequency system.

To help illustrate, an electronic device 10 that may utilize a radio frequency system 12 having distortion correction logic 13 is described in FIG. 1. As will be described in more detail below, the electronic device 10 may be any suitable electronic device, such as a handheld computing device, a tablet computing device, a notebook computer, and the like. As depicted, the electronic device 10 includes the radio frequency system 12 having phase path distortion correction logic 13 (e.g., hardware-based circuitry and/or processor-implemented instructions stored on a non-transitory machine-readable medium), input structures 14, memory 16, one or more processor(s) 18, one or more storage devices 20, a power source 22, input/output ports 24, and an electronic display 26. The various components described in FIG. 1 may include hardware elements (including circuitry), software elements (including instructions stored on a non-transitory computer-readable medium), or a combination of both hardware and software elements.

It should be noted that FIG. 1 is merely one example of a particular implementation and is intended to illustrate the types of components that may be present in the electronic device 10. Additionally, it should be noted that the various depicted components may be combined into fewer components or separated into additional components. For example, the memory 16 and a storage device 20 may be included in a single component.

As depicted, the processor 18 is operably coupled with memory 16 and the storage device 20. More specifically, the processor 18 may execute instruction stored in memory 16 and/or the storage device 20 to perform operations in the electronic device 10, such as instructing the radio frequency system 12 to communicate with another device. As such, the processor 18 may include one or more general purpose microprocessors, one or more application specific processors (ASICs), one or more field programmable logic arrays (FPGAs), or any combination thereof. Additionally, memory 16 and/or the storage device 20 may be a tangible, non-transitory, computer-readable medium that stores instructions executable by and data to be processed by the processor 18. For example, the memory 16 may include random access memory (RAM) and the storage device 20 may include read only memory (ROM), rewritable flash memory, hard drives, optical discs, and the like.

Additionally, as depicted, the processor 18 is operably coupled to the power source 22, which provides power to the various components in the electronic device 10. As such, the power source 22 may includes any suitable source of energy, such as a rechargeable lithium polymer (Li-poly) battery and/or an alternating current (AC) power converter. Furthermore, as depicted, the processor 18 is operably coupled with I/O ports 24, which may enable the electronic device 10 to interface with various other electronic devices, and input structures 14, which may enable a user to interact with the electronic device 10. Accordingly, the inputs structures 14 may include buttons, keyboards, mice, trackpads, and the like. Additionally, in some embodiments, the electronic display 26 may include touch sensitive components.

In addition to enabling user inputs, the electronic display 26 may display image frames, such as a graphical user interface (GUI) for an operating system, an application interface, a still image, or video content. As depicted, the electronic display 26 is operably coupled to the processor 18. Accordingly, the image frames displayed by the electronic display 26 may be based on display image data received from the processor 18.

As depicted, the processor 18 is also operably coupled with the radio frequency system 12, which may facilitate communicatively coupling the electronic device 10 to one or more other electronic devices and/or networks. For example, the radio frequency system 12 may enable the electronic device 10 to communicatively couple to a personal area network (PAN), such as a Bluetooth network, a local area network (LAN), such as an 802.11x Wi-Fi network, and/or a wide area network (WAN), such as a 4G or LTE cellular network.

As can be appreciated, the radio frequency system 12 may enable communication using various communication protocols. However, operational principles of the radio frequency system 12 may be similar for each of the communication protocols (e.g., Bluetooth, LTE, 802.11x Wi-Fi, etc). For example, regardless of communication protocol, the radio frequency system 12 generally converts a digital electrical signal containing data desired to be transmitted into an analog electrical signal using a transceiver. The analog electrical signal may then be amplified using a power amplifier, filtered using a filter, and transmitted using an antenna. In other words, the techniques described herein may be applicable to any suitable radio frequency system 12 that operates in any suitable manner regardless of communication protocol used.

Communications of the radio frequency system 12 may be enhanced by reducing distortion caused on the phase path of a polar architecture of the radio frequency system 12. As will be discussed in more detail below, the distortion correction logic 13 may be useful to reduce such distortion. For example, the distortion correction logic 13 may implement a pre-distortion signal into a baseband signal, such that the distortions caused on the phase path of the radio frequency system 12 result in the expected signal without the phase path distortion.

Figure 2:
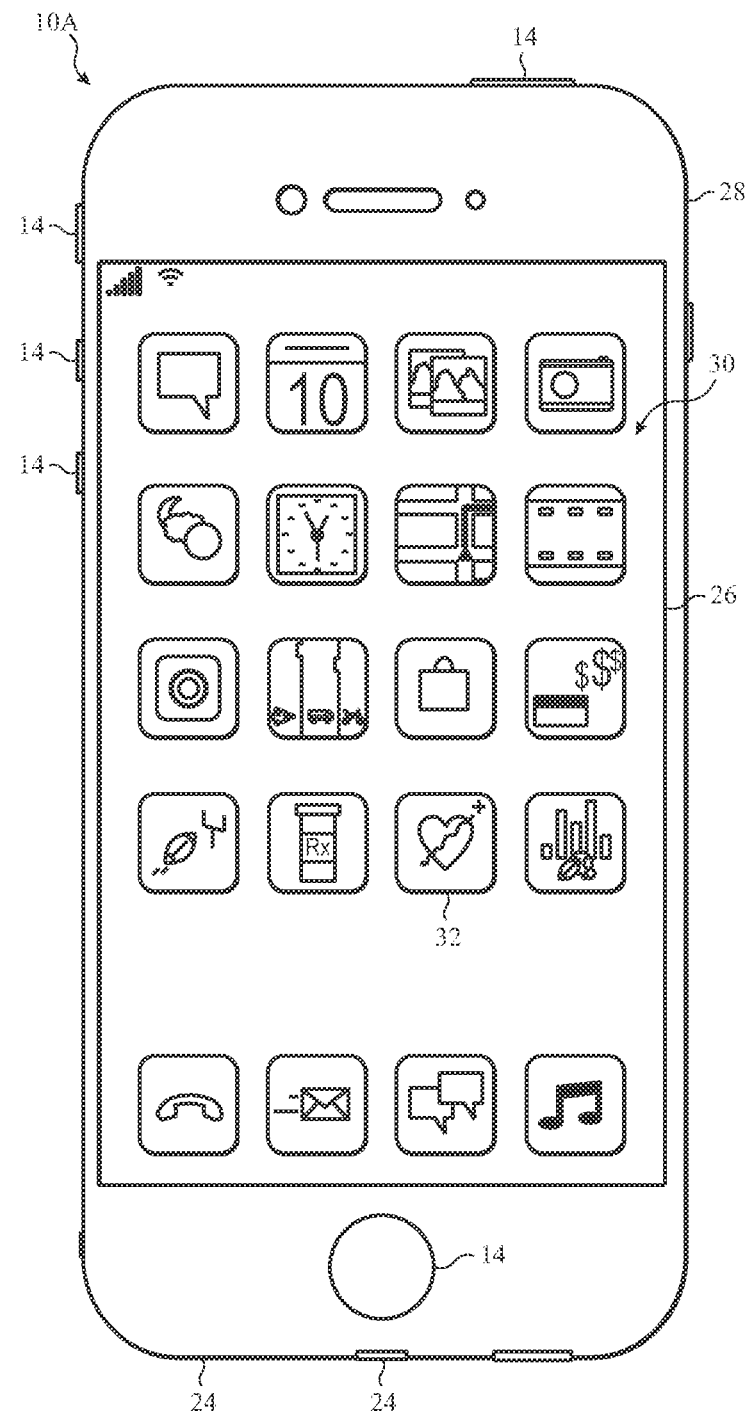
FIG. 2 is a block diagram illustrating the electronic device of FIG. 1 in the form of a handheld electronic device, in accordance with an embodiment.

As described above, the electronic device 10 may be any suitable electronic device. To help illustrate, one example of a handheld device 10A is described in FIG. 2, which may be a portable phone, a media player, a personal data organizer, a handheld game platform, or any combination of such devices. For example, the handheld device 10A may be a smart phone, such as any iPhone® model available from Apple Inc. As depicted, the handheld device 10A includes an enclosure 28, which may protect interior components from physical damage and to shield them from electromagnetic interference. The enclosure 28 may surround the electronic display 26, which, in the depicted embodiment, displays a graphical user interface (GUI) 30 having an array of icons 32. By way of example, when an icon 32 is selected either by an input structure 14 or a touch sensing component of the electronic display 26, an application program may launch.

Additionally, as depicted, input structures 14 may open through the enclosure 28. As described above, the input structures 14 may enable a user to interact with the handheld device 10A. For example, the input structures 14 may activate or deactivate the handheld device 10A, navigate a user interface to a home screen, navigate a user interface to a user-configurable application screen, activate a voice-recognition feature, provide volume control, and toggle between vibrate and ring modes. Furthermore, as depicted, the I/O ports 24 open through the enclosure 28. In some embodiments, the I/O ports 24 may include, for example, an audio jack to connect to external devices. Additionally, the radio frequency system 12 may also be enclosed within the enclosure 28 and internal to the handheld device 10A.

Figure 3:
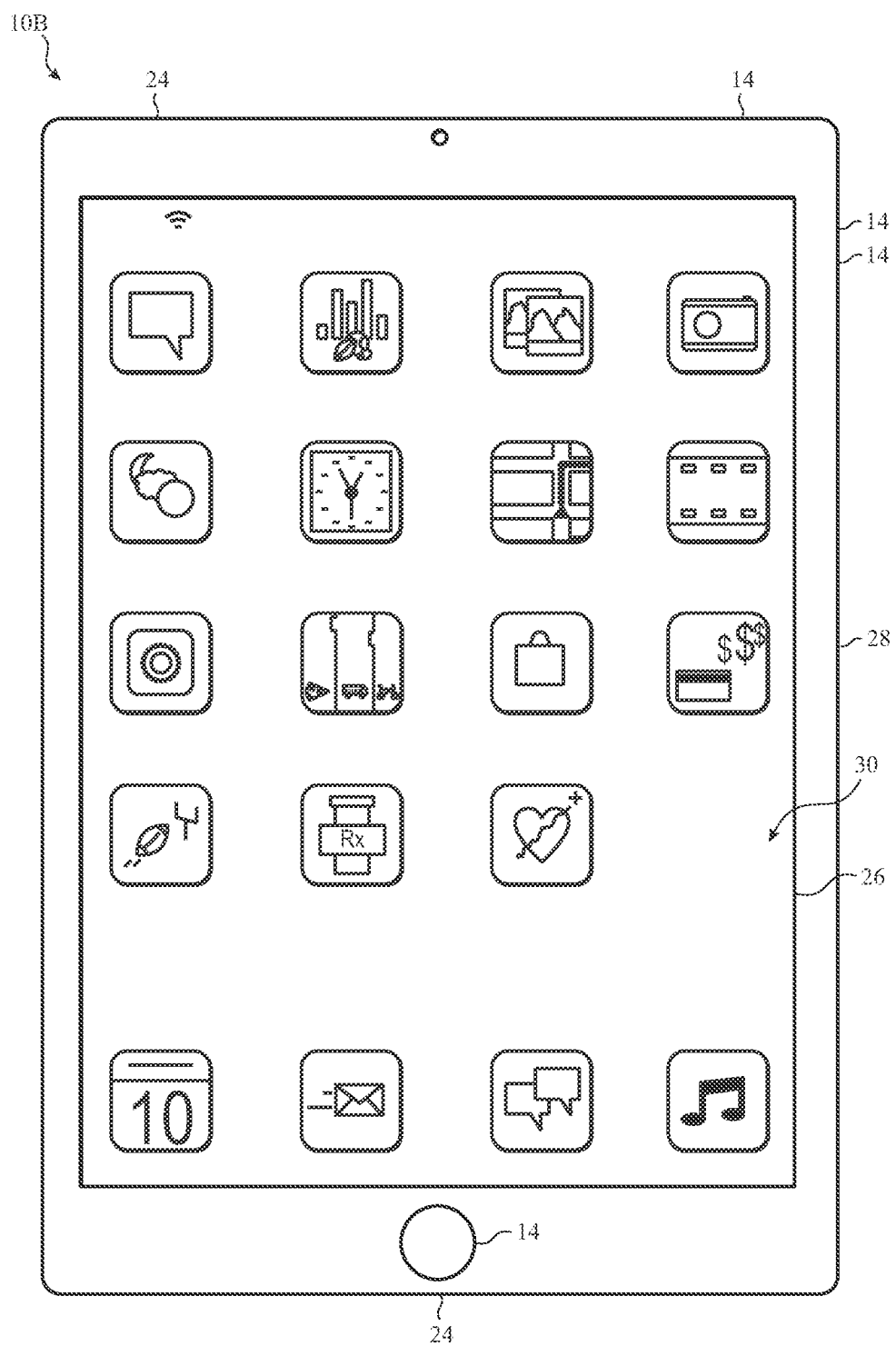
FIG. 3 is a block diagram illustrating the electronic device of FIG. 1 in the form of a tablet electronic device, in accordance with an embodiment.
Figure 4:
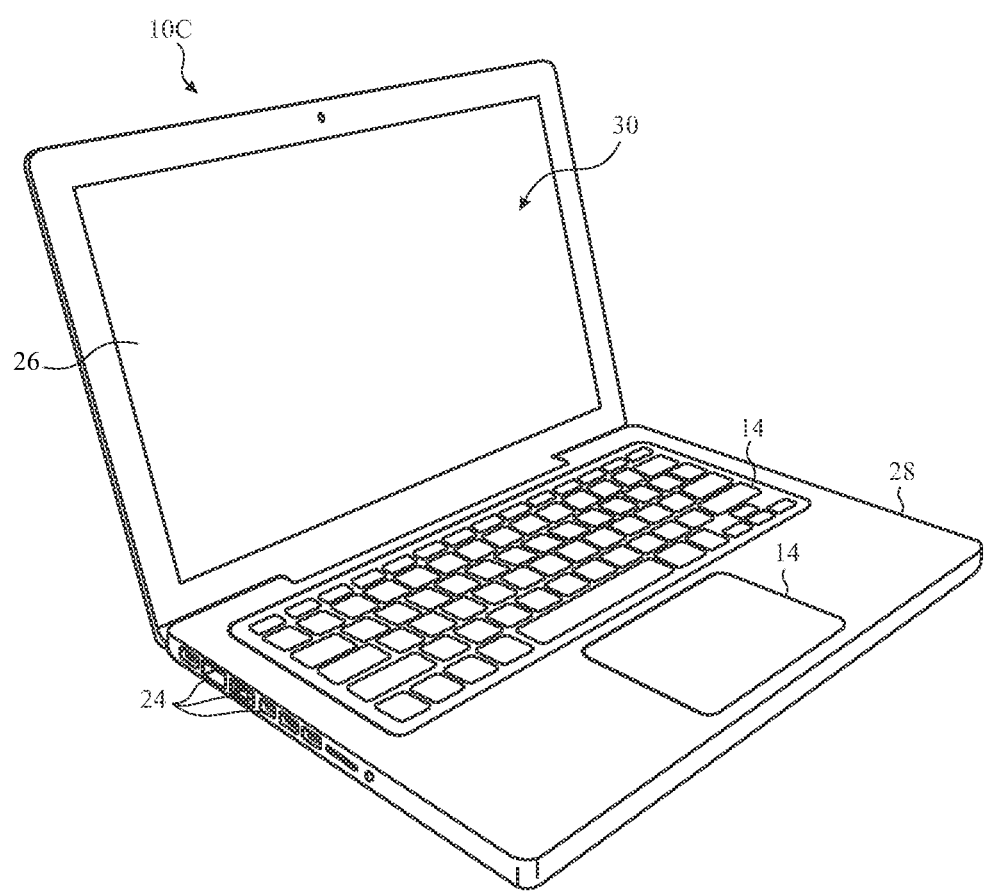
FIG. 4 is a block diagram illustrating the electronic device of FIG. 1 in the form of a computer, in accordance with an embodiment.

To further illustrate a suitable electronic device 10, a tablet device 10B is described in FIG. 3, such as any iPad® model available from Apple Inc. Additionally, in other embodiments, the electronic device 10 may take the form of a computer 10C as described in FIG. 4, such as any Macbook® or iMac® model available from Apple Inc. As depicted, the tablet device 10B and the computer 10C also each includes an electronic display 26, input structures 14, I/O ports 24, and an enclosure 28. Similar to the handheld device 10A, the radio frequency system 12 may also be enclosed within the enclosure 28 and internal to the tablet device 10B and/or the computer 10C.

Figure 5:
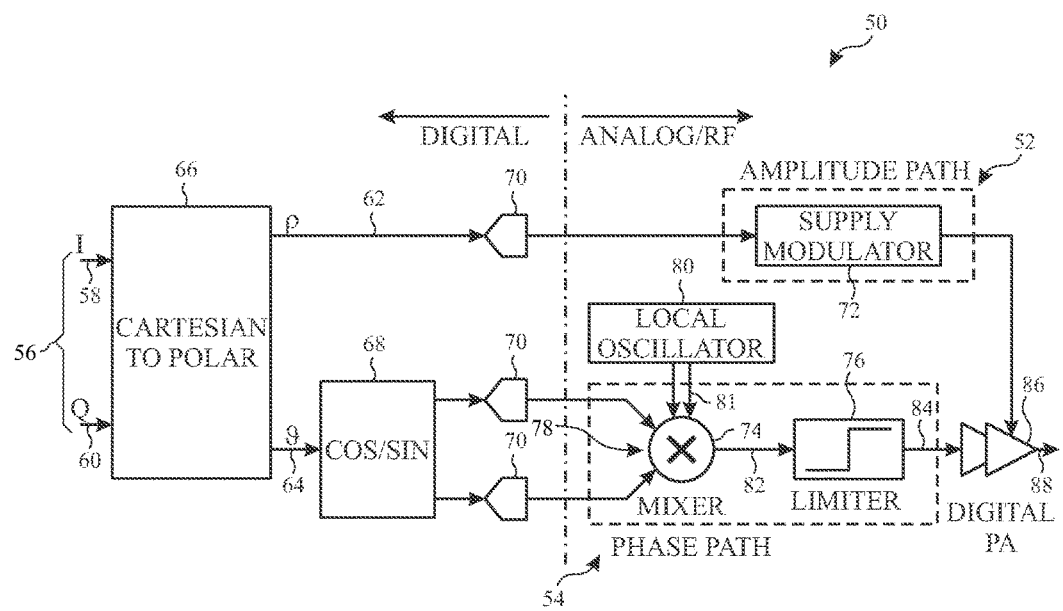
FIG. 5 is a block diagram illustrating a direct polar architecture having an amplitude path and a phase path.

As described above, the radio frequency system 12 may facilitate communication with other electronic devices and/or a network by wirelessly communicating data. FIG. 5 is a block diagram illustrating a radio frequency system 50 having a direct polar architecture with an amplitude path 52 and a phase path 54. As depicted in FIG. 5, the baseband signal 56 in the Cartesian domain (e.g., the I value 58 and Q value 60) is converted to the polar domain (e.g., ρ value 62 and θ value 64), using the Cartesian to polar logic 66 (e.g., hardware circuitry and/or processor implemented instructions). The θ value 64 is processed through cos/sin logic 68. The resulting signals and the ρ value 62 are passed through digital to analog converters (DACs) 70 to convert the signals from digital to analog. Once passed through the DACs 70, the baseband digital signals form the amplitude (AM) path 52 and the phase (PM) path 54.

The amplitude path 52 may include a supply modulator 72, which may provide supply voltage modulation of the analog-converted ρ signal 62. Further, the PM path 54 may include a mixer 74 and a limiter 76. The mixer 74 may multiply the low frequency baseband signal (fBB) 78 by a local oscillator 80 signal (fLO) 81. Further, the mixer 74 may up-convert the signal from the baseband frequencies to radio frequencies (fRF) 82. The limiter 76 may amplify the signal to the positive and negative rails at the output 84. Upon completed processing by the supply modulator 72 on the amplitude path 52 and the limiter 76 on the phase path 54, the AM path 52 and the PM path 54 may be combined and amplified at one or more digital power amplifiers 86, forming a resultant modulated radio frequency signal 88.

As discussed in more detail below, the mixer 74 and limiter 76 may source a significant amount of distortion in the phase path 54 in the radio frequency system 50. Accordingly, as will be discussed in more detail below, pre-distortion of the phase path 54 signals may be used to reduce this distortion.

Figure 6:
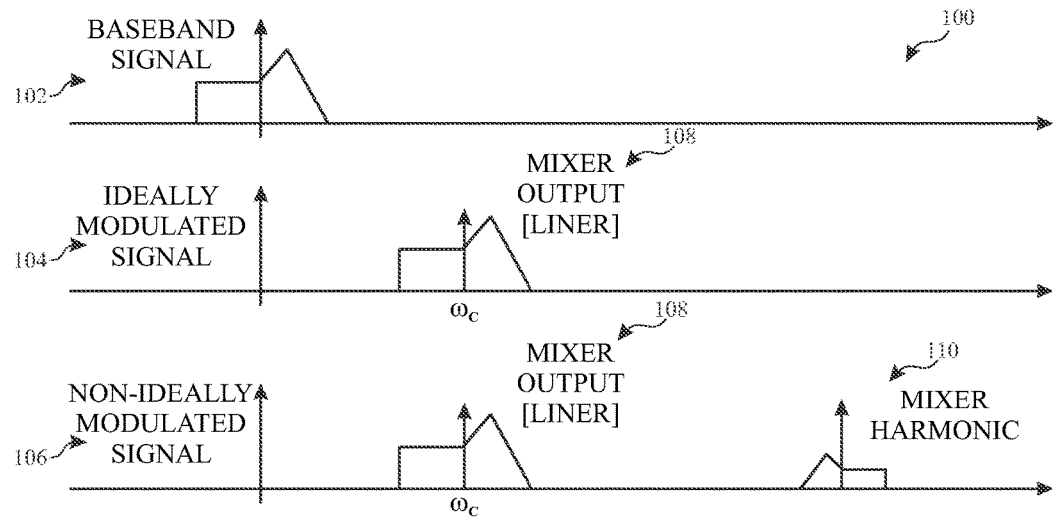
FIG. 6 is a diagram illustrating a comparison of a baseband signal, phase-path pre-distorted signal, and a phase-path signal without pre-distortion, in accordance with an embodiment.

FIG. 6 is a diagram 100 illustrating a comparison of a baseband signal 102, phase-path pre-distorted signal 104, and a phase-path signal 106 without pre-distortion, in accordance with an embodiment. As previously mentioned, the mixer 74 and/or limiter 76 may result in significant distortion of the phase path signal. For example, as illustrated in the phase-path signal 106 without pre-distortion, the mixer output 108 includes distortion (e.g., a mixer harmonic 110). In contrast, the phase-path pre-distorted signal 104 results in a mixer output 108 without the mixer harmonic 110, resulting in less distortion and a cleaner output 108.

Figure 7:
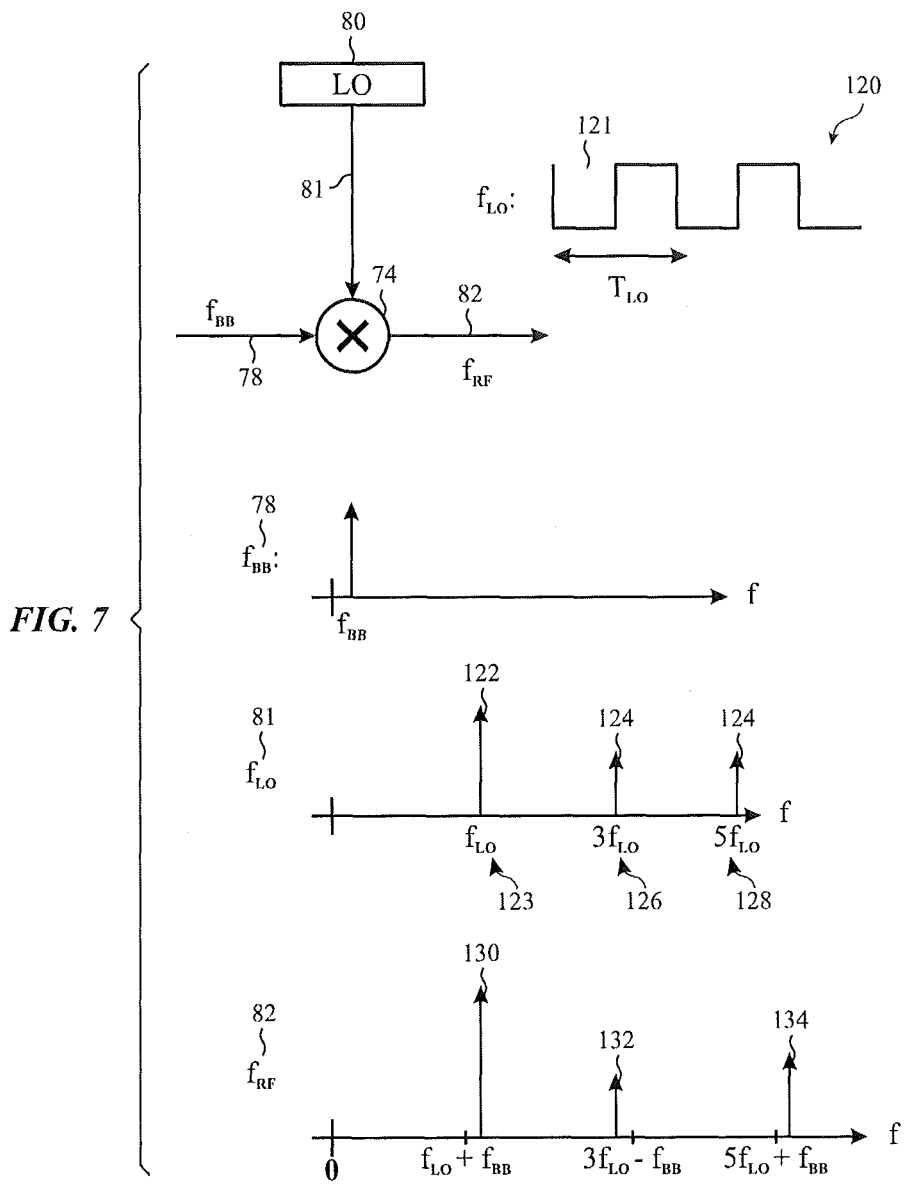
FIG. 7 is a block diagram illustrating the extra harmonics that result from the mixer component of FIG. 5, in accordance with an embodiment.

To understand the mixer-caused distortion, the discussion now briefly turns toward the mixer functionality and its harmonic output. FIG. 7 is a block diagram 120 illustrating the extra harmonics that result from the mixer component 74 of FIG. 5, in accordance with an embodiment. As previously mentioned, the mixer 74 multiplies the low frequency baseband signal (fBB) 78 by a local oscillator 80 signal (fLO) 81.

Further, the mixer 74 up-converts the signal from baseband frequencies to radio frequencies (fRF) 82.

As illustrated, the fLO signal 81 is a square wave signal 121. In addition to having frequency content 122 at its fundamental frequency (fLO) 123, this wave signal 121 has harmonics 124 at 3fLO 126, 5fLO 128, etc. Accordingly, when the fBB signal 78 is multiplied by the fLO signal 81, the fLO+fBB content 130 is up-converted, but so are the additional harmonics (e.g., 3fLO−fBB 132, 5fLO+fBB 134, etc.). These up-converted harmonics add distortion to the signal. Unfortunately, because polar architectures sometimes use subsequent non-linear limiters (e.g., limiter 76 of FIG. 5), these harmonics may not be easily filtered.

Figure 8:
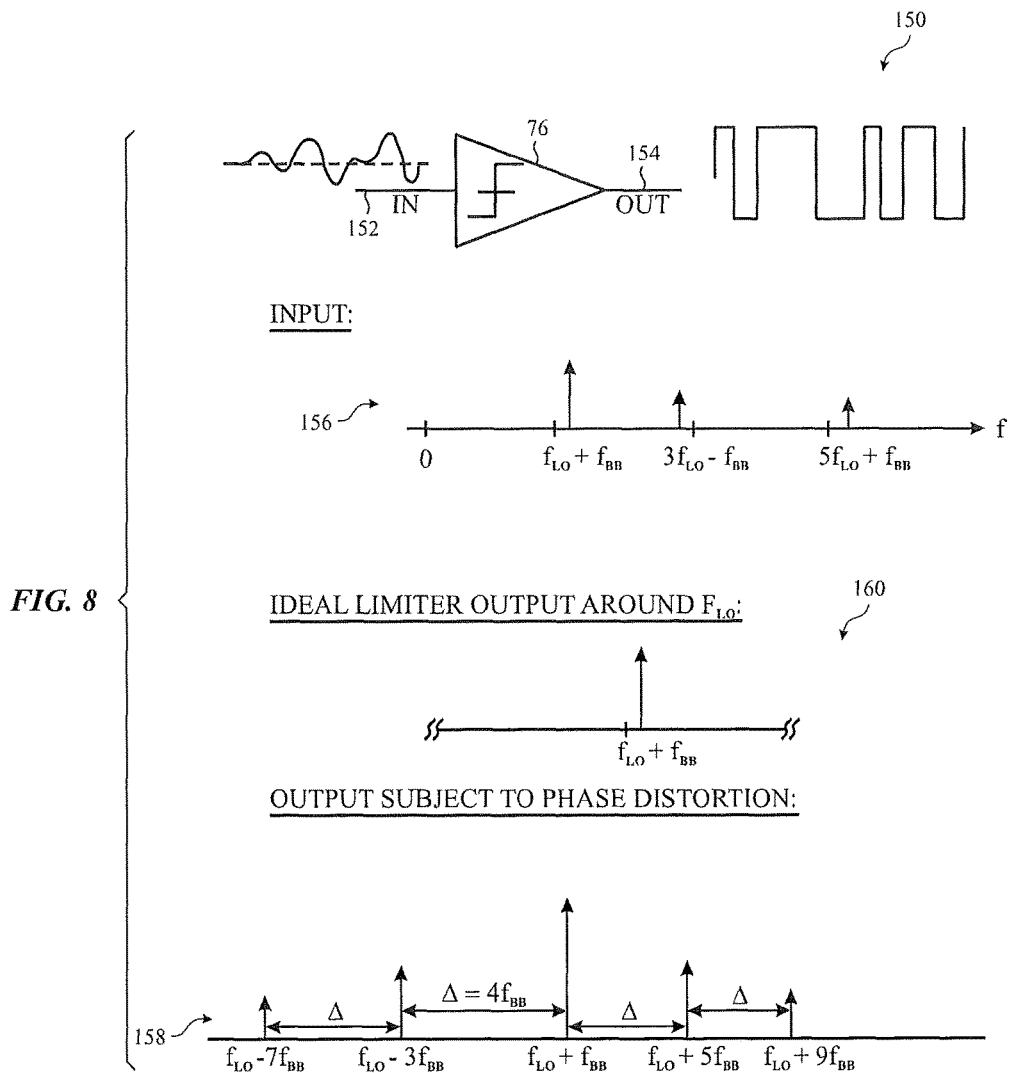
FIG. 8 is a block diagram illustrating the non-linearity of the limiter component of FIG. 5, in accordance with an embodiment.

Turning now to a discussion of the limiter 76, FIG. 8 is a block diagram 150 illustrating the non-linearity of the limiter 76 component of FIG. 5, in accordance with an embodiment. The limiter 76 may be represented as an odd function where an odd polynomial in x may be chosen to represent the approximating function:

$$f_n(x) = a_1 x + a_3 x^3 + \ldots + a_{2n-1} x^{2n-1}$$

using:

$$f_n(x) = k_n \sum_{r=o}^{n-1} \binom{n-1}{r} (-1)^r \frac{x^{2r+1}}{2r+1} \quad (n > 0)$$

The limiter 76 is a highly non-linear block that amplifies the input signal 152 (e.g., the fRF signal 82 of FIGS. 5 and 7) to the positive and negative rails at the output 154 (e.g., output 84 of FIG. 5). As illustrated, due to the limiter 76 non-linearity, if two tones f1 and f2 are present at the input, then all the intermodulation tones at n f1+m f2 will appear at the limiter output. Looking back at FIG. 8, additional tones were present at 3fLO−fBB and 5fLO+fBB. This is shown in the input 156 of FIG. 8. Because these tones are present at the limiter 76 input, these tones will mix together and create inter-modulation tones at the limiter 76 output. For example, some inter-modulated tones might include: −2(fLO+fBB)+1(3fLO−fBB)=fLO−3fBB, 4(fLO+fBB)−1 (3fLO−fbb)=fLO+5fBB, −5(fLO+fBB)+2(3fLO−fBB) =fLO−7fBB, 7(fLO+fBB)−2(3fLO−fBB)=fLO−9fBB, etc. Accordingly, as illustrated in the output subject to phase distortion 158, each of the inter-modulated tones are spaced at multiples of 4fBB with respect to the main tone fLO+fBB. In contrast, the ideal limiter output 160 resulting in an ideal output that is not subject to phase distortion only includes a tone at fLO+fBB.

Having illustrated the presence of the phase-path distortion, the discussion now turns to an illustration of this distortion's impairment of the radio frequency signal. FIG. 9 is a schematic diagram 200 illustrating the impact of the phase-path distortion of the radio frequency system 50 of FIG. 5, in accordance with an embodiment. Specifically, when a phasor A1 202 is provided through the transmitter chain of the radio frequency system 50, the transmitter adds unwanted phasors A4*i*+1 204 and A4*i*−1 206, because of the added inter-modulated tones discussed in FIG. 8. These added phasors result in a modification of the phase trajectory. Specifically, the trajectory is modified according to:

$$A_1 e^{J\vartheta} \xrightarrow{f} A_1 e^{J\vartheta} + \sum_i \left[ A_{4i-1} e^{-J[4i-1](\vartheta)} + \tilde{A}_{4i+1} e^{J[4i+1](\vartheta)} \right]$$

Figure 11:
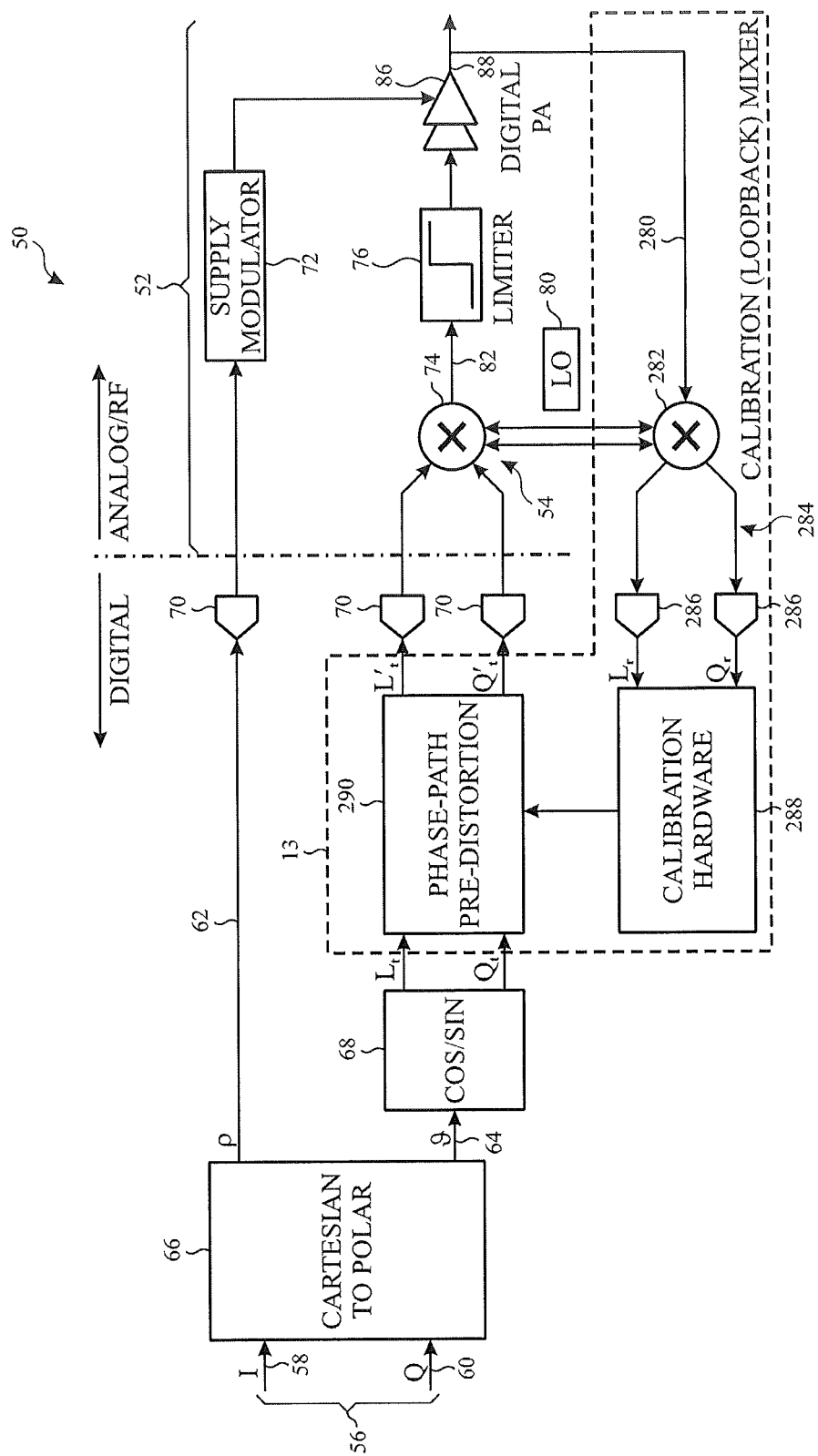
FIG. 11 is a block diagram illustrating a polar architecture radio frequency system with phase-path pre-distortion circuitry, in accordance with an embodiment.

FIG. 10 is a flowchart illustrating a process 250 for reducing phase path modulation, in accordance with an embodiment. The process 250 may be implemented via hardware-based circuitry, processor-based instructions implemented by a computer processor, or a combination thereof. FIG. 11 is a block diagram illustrating a polar architecture radio frequency system with phase-path pre-distortion circuitry that may implement the process 250 of FIG. 10, in accordance with an embodiment. For clarity, these figures will be discussed concurrently.

Similar to radio frequency system 50 of FIG. 5, the radio frequency system 12 has a polar architecture with an amplitude path 52 and a phase path 54. As depicted in FIG. 11, the baseband signal 56 in the Cartesian domain (e.g., the I value 58 and Q value 60) is converted to the polar domain (e.g., ρ value 62 and ϑ value 64), using the Cartesian to polar logic 66 (e.g., hardware circuitry and/or processor implemented instructions). The ϑ value 64 is processed through cos/sin logic 68 and then are provided to the distortion correction logic 13, which may introduce distortion to the signals. The resulting signals and the ρ value 62 are passed through digital to analog converters (DACs) 70 to convert the signals from digital to analog. Once passed through the DACs 70, the baseband digital signals form the amplitude (AM) path 52 and the phase (PM) path 54.

Similar to system 50 of FIG. 5, the amplitude path 52 may include a supply modulator 72, which may provide supply voltage modulation of the analog-converted ρ signal 62. Further, the PM path 54 may include a mixer 74 and a limiter 76. The mixer 74 may multiply the low frequency baseband signal (fBB) 78 by a local oscillator 80 signal (fLO) 81. Further, the mixer 74 may up-convert the signal from the baseband frequencies to radio frequencies (fRF) 82. The limiter 76 may amplify the signal to the positive and negative rails at the output 84. Upon completed processing by the supply modulator 72 on the amplitude path 52 and the limiter 76 on the phase path 54, the AM path 52 and the PM path 54 may be combined and amplified at one or more digital power amplifiers 86, forming a resultant modulated radio frequency signal 88.

Unlike the system 50 of FIG. 5, the current system 12 is pre-distorted by the distortion logic 13. Because the pre-distortion is specifically designed to counter-act the distortion caused by the mixer 74 and limiter 76, the distortion introduced by the mixer 74 and limiter 76 may result in the original signal shape at the resultant modulated radio frequency signal 88. For example, in some embodiments, prior to sending the waveform to the radio, the signal is pre-distorted according to:

$$A_1 e^{J\vartheta} \xrightarrow{f^{-1}} \tilde{A}_1 e^{J\vartheta}$$

The pre-distorted waveform, once passed through the radio, generates an ideal replica of the ideal signal, as illustrated by the equation:

$$\tilde{A}_1 e^{J\vartheta} + \sum_i \left[ \tilde{A}_{4i-1} e^{-J[4i-1](\vartheta)} + \tilde{A}_{4i+1} e^{J[4i+1]f^{-1}(\vartheta)} \right] \to A_1 e^{J\vartheta}$$

To illustrate how this is done, the discussion now turns to the process 250. The process 250 begins by the distortion logic 13 receiving and mixing the modulated radio frequency signal 88. Indeed, as illustrated in FIG. 11, a calibration loopback 280 from the radio frequency signal 88 is provided to a calibration mixer 282. The calibration mixer 282 may receive and mix the frequency signal 88 with a local oscillator 80 (block 252). The mixer 282 output may down-convert the resultant signal 284 to the baseband frequencies (e.g., via the auxiliary DACs 286) (block 254).

The down-converted signal may be provided to the calibration hardware 288, where an inverse kernel is estimated (block 256). For example, a tone $e^{j\theta}$ is transmitted through the phase path 54. Using the data samples received via the calibration loopback 280 at the calibration hardware 288, the coefficients of a forward kernel $\alpha_i^+$ and $\alpha_i^-$, may be estimated. For example, the following equation may be used to estimate the coefficients for the forward kernels:

$$y[\theta] = e^{j\theta}\left(1 + \sum_i \alpha_i^+ e^{j4i\theta} + \alpha_i^- e^{j-4i\theta}\right)$$

Accordingly, the inverse function may be obtained from based upon the estimated forward kernels. Based upon the previous equation, the inverse function may be estimated as:

$$f^{-1}(\theta) = \frac{e^{j\theta}}{1 + \sum_i \alpha_i^+ e^{j4i\theta} + \alpha_i^- e^{j-4i\theta}}$$

For example, in one embodiment, a phasor $A_1 e^{J(n\omega - \theta_d)}$ may be transmitted through the transmitter of the radio frequency system 12. The received data from this transmission may be represented as:

$$y[n] = A_1 e^{-j\theta_d} e^{jn\omega}\left(1 + \sum_i \left[\frac{A_{4i-1}^- e^{j4i\theta_d}}{A_1} e^{-j[4i]n\omega} + \frac{A_{4i+1}^+ e^{j-4i\theta_0}}{A_1} e^{j[4i]n\omega}\right]\right)$$

The coefficients $A_{4i+1}$ and $A_{4i-1}$ may be estimated using regression analysis, such as using a least-squares method. Thus, it may be readily verifiable that:

$$\angle \alpha_i^+ = \angle A_{4i+1} - (4i+1)\angle A_1$$

$$\angle \alpha_i^- = \angle A_{4i-1} + (4i-1)\angle A_1$$

$$|\alpha_i^+| = \frac{|A_{4i+1}|}{|A_1|}$$

$$|\alpha_i^-| = \frac{|A_{4i-1}|}{|A_1|}$$

Using this inverse kernel, a new phase-path pre-distortion may be introduced to the forward signals (block 258). For example phase-path pre-distortion logic 290 may insert the pre-distortion prior to digital to analog conversion by the DACs 70 on the phase path 54. Accordingly, the pre-distortion may counter-act the subsequent distortion caused by the mixer 74 and/or limiter 76.

In some cases, uncertainty between the phase of the forward phase path 54 and the calibration loopback mixer 282 may result in a shift of the phasors by the same amount. This may be illustrated by:

$$\angle A_{4i+1} \rightarrow \angle A_{4i+1} + \phi$$

$$\angle A_{4i-1} \rightarrow \angle A_{4i-1} + \phi$$

$$\angle A_1 \rightarrow \angle A_1 + \phi$$

As such, the estimated phases may become biased. This may be represented by:

$$\angle \alpha_i^+ \rightarrow \angle \alpha_i^+ - 4i\phi$$

$$\angle \alpha_i^- \rightarrow \angle \alpha_i^- + 4i\phi$$

To compensate for this, the phase uncertainty may be estimated and corrected. FIG. 12 is a flowchart that illustrates a process 300 for estimating and correcting for phase uncertainty, in accordance with an embodiment. The process 300 begins by estimating the coefficients of the forward kernel, as discussed above (block 302). For example, the following coefficients are estimated:

$$\alpha_1^+, \alpha_1^-, \alpha_2^+, \alpha_2^-,$$

With the inverse function in place, coefficients of the forward kernel are estimated. For example, the following are estimated:

$$\gamma_1^+, \gamma_1^-, \gamma_2^+, \gamma_2^-,$$

Based upon these estimated parameters, a solution to the following second order equation is found:

$$z_0 = \frac{-(\gamma_1^- - \alpha_1^-) \pm \sqrt{(\gamma_1^- - \alpha_1^-)^2 - 4\gamma_2^- \alpha_1^- \alpha_1^+}}{2\alpha_1^-}$$

Next, the phase uncertainty is estimated (block 304). For example, the phase uncertainty may be estimated according to:

$$\theta_o = \frac{\angle(z_o)}{4}$$

The estimated coefficients of the forward kernel may then be updated based upon the estimated phase uncertainty (block 306). For example, the coefficients may be adjusted according to:

$$\alpha_i^+[\text{new}] = \alpha_i^+[\text{old}] e^{j4i\theta_0}$$

$$\alpha_i^-[\text{new}] = \alpha_i^-[\text{old}] e^{-j4i\theta_0}$$

The benefits of pre-distortion on the phase-path of a polar architecture radio frequency system are vast. For example, by counteracting distortion caused on the phase-path, a cleaner signal may be provided by the transmitter of the radio frequency system. In testing the techniques described herein, significant reduction in signal distortion was observed. For example, testing a radio frequency system without the distortion correction logic described herein, distortion levels of approximately −45 dB were found at 4fBB. Further, distortion levels of −55 dB were found at 8 fBB. In contrast, similar radio frequency systems with the above-described distortion correction logic resulted in greatly reduced distortion. For example, at 4fBB, the distortion level was approximately −60 dB. Additionally, at 8 fBB, the distortion level was approximately −70 db. As may be appreciated, this reduced distortion may result in significant transmission improvement for radio frequency systems.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

What is claimed is:

1. A radio frequency system comprising:
a polar architecture configured to provide a ρ digital electrical signal and a ϑ digital electrical signal representative of a data transmission;
at least one digital to analog converter configured to convert the ρ digital electrical signal and the ϑ digital electrical signal to a ρ analog electrical signal and a ϑ analog electrical signal, wherein the ρ analog electrical signal is transmitted on an amplitude path and the ϑ analog electrical signal is transmitted on a phase path, wherein the amplitude path comprises a supply modulator configured to modulate a voltage of the ρ analog electrical signal, wherein the phase path comprises:
a mixer configured to multiply a low frequency baseband signal (fBB) by a local oscillator signal and up-convert a resultant signal from baseband frequency to radio frequency (fRF); and
a limiter communicatively coupled to the at least one mixer, configured to amplify the resultant signal after it is up-converted;
an antenna configured to wirelessly transmit a combination of signals on the amplitude path and the phase path at a transmission frequency; and
distortion correction logic configured to counter-act distortion on the phase path of the radio frequency system, such that distortion caused by the limiter and the mixer on the phase path is reduced, at least in part by:
estimating coefficients of a forward kernel of the phase path by performing a regression on a mathematical representation of a transmitted phasor, wherein the forward kernel comprises a definition of the distortion on the phase path caused by the limiter and the mixer, the distortion on the phase path represented by a summation of unwanted phasors, wherein the unwanted phasors comprise intermodulated tones ($e^{j4i\theta}$ and $e^{-j4i\theta}$) each multiplied by a respective one of the coefficients of the forward kernel;
estimating an inverse kernel of the forward kernel; and
generating and introducing a phase-path pre-distortion to the phase path using the inverse kernel.

2. The radio frequency system of claim 1, wherein the distortion correction logic is configured to introduce the phase-path pre-distortion prior to converting the ϑ digital electrical signals to ϑ analog electrical signals.

3. The radio frequency system of claim 1, wherein introducing the phase-path pre-distortion comprises introducing a pre-distortion on a digital signal, such that subsequent distortion caused by the limiter and the mixer on the phase-path results in a signal returning to its original shape.

4. The radio frequency system of claim 1, wherein the distortion correction logic comprises:
a calibration mixer configured to mix a calibration signal with a local oscillator signal and output a down-converted calibration signal; and
a calibration feedback loop configured to transmit the down-converted calibration signal for estimation of the inverse kernel, wherein the down-converted calibration signal comprises the combination of signals on the amplitude path and the phase path.

5. The radio frequency system of claim 4, wherein the distortion correction logic comprises one or more auxiliary analog to digital converters configured to convert analog outputs of the calibration mixer into one or more calibration digital signals.

6. The radio frequency system of claim 5, wherein the distortion correction logic comprises calibration hardware configured to:
receive the one or more calibration digital signals; and
estimate the inverse kernel using the one or more calibration digital signals.

7. The radio frequency system of claim 1, wherein the distortion correction logic is configured to reduce phase modulated (PM)-to-PM distortion, PM-to-amplitude modulated (AM) distortion, or both caused by processing over separate AM and PM paths.

8. The radio frequency system of claim 1, wherein the distortion correction logic is configured to compensate for uncertainty between a phase of a mixer component on the phase path and a calibration mixer of the distortion correction logic.

9. The radio frequency system of claim 8, wherein the distortion correction logic is configured to compensate for the uncertainty by adjusting coefficients of a forward kernel of the phase path.

10. The radio frequency system of claim 1, wherein the distortion correction logic is configured to reduce distortions at one or more four times frequency base band (4fBB) spacings from each tone of the phase path.

11. The radio frequency system of claim 1, wherein the distortion correction logic is configured to estimate the coefficients of the forward kernel of the phase path according to Equation 1:

$$y[\theta] = e^{j\theta}\left(1 + \sum_i \alpha_i^+ e^{j4i\theta} + \alpha_i^- e^{-j4i\theta}\right); \quad \text{Equation 1}$$

wherein:
$e^{j\theta}$ corresponds to a tone transmitted via the phase path; and
$\alpha_i^+$ and $\alpha_i^-$ correspond to the coefficients of the forward kernel.

12. A method for operating a radio frequency system, comprising:
providing a ρ digital electrical signal and a ϑ digital electrical signal representative of a data transmission to one or more digital to analog converters;
converting the ρ and ϑ digital electrical signals to a ρ analog electrical signal and a ϑ analog electrical signal using the one or more digital to analog converters;
transmitting the ρ analog electrical signal on an amplitude path, wherein the amplitude path comprises a supply modulator configured to modulate a voltage of the ρ analog electrical signal;
transmitting the ϑ analog electrical signal on a phase path, wherein the phase path comprises:
a mixer configured to multiply a low frequency baseband signal (fBB) by a local oscillator signal and up-convert a resultant signal from baseband frequency to radio frequency (fRF); and
a limiter communicatively coupled to the at least one mixer, configured to amplify the resultant signal after it is up-converted;
wirelessly transmitting a combination of signals on the amplitude path and the phase path at a transmission frequency; and counter-acting distortion on the phase path of the radio frequency system using distortion correction circuitry, such that distortion caused by the limiter and the mixer on the phase path is reduced, at least in part by:
  estimating coefficients of a forward kernel of the phase path by performing a regression on a mathematical representation of a transmitted phasor, wherein the forward kernel comprises a definition of the distortion on the phase path caused by the limiter and the mixer, the distortion on the phase path represented by a summation of unwanted phasors, wherein the unwanted phasors comprise intermodulated tones ($e^{j^A\theta}$ and $e^{j^{-A\theta}}$) each multiplied by a respective one of the coefficients of the forward kernel;
  estimating an inverse kernel of the forward kernel; and
  generating and introducing a phase-path pre-distortion to the phase path using the inverse kernel.

13. The method of claim 12, wherein introducing the phase-path pre-distortion comprises introducing a pre-distortion on a digital signal, such that subsequent distortion by the limiter and the mixer on the phase path results in a signal returning to its original shape.

14. The method of claim 13, comprising introducing the pre-distortion prior to converting the ϑ digital electrical signals to ϑ analog electrical signals.

15. The method of claim 13, comprising:
  obtaining samples of the combination of signals, via a calibration loopback; and
  introducing the pre-distortion based upon the samples.

16. The method of claim 15, comprising converting a baseband signal in a Cartesian domain into a Polar domain.

17. The method of claim 16, comprising:
  mixing the samples with a local oscillator signal to obtain a mixer output;
  down-converting the mixer output via one or more auxiliary analog to digital converters; and
  introducing the pre-distortion based upon the down-converted mixer output.

18. The method of claim 17, comprising:
  determining the inverse kernel based upon the down-converted mixer output, wherein the inverse kernel is configured to invert phase-path nonlinearity of the samples.

19. The method of claim 18, comprising:
  counter-acting phase modulated (PM)-to-PM distortion, PM-to-amplitude modulated (AM) distortion, or both caused by processing over separate AM and PM paths.

20. The method of claim 18, wherein the inverse kernel is determined by:
  estimating an inverse function of a forward kernel by estimating coefficients of the forward kernel based upon the samples from the calibration loopback.

21. Distortion correction circuitry, comprising:
  phase path pre-distortion circuitry configured to introduce pre-distortion to a digital signal of a polar architecture of a radio frequency system, such that distortion caused by a limiter and a mixer on a phase path of the polar architecture results in the digital signal returning to its original shape prior to inducing the pre-distortion to the digital signal, at least in part by:
    estimating coefficients of a forward kernel of the phase path by performing a regression on a mathematical representation of a transmitted phasor, wherein the forward kernel comprises a definition of the distortion on the phase path caused by the limiter and the mixer, the distortion on the phase path represented by a summation of unwanted phasors, wherein the unwanted phasors comprise intermodulated tones ($e^{j^A\theta}$ and $e^{j^{-A\theta}}$) each multiplied by a respective one of the coefficients of the forward kernel;
    estimating an inverse kernel of the forward kernel; and
    generating and introducing a phase-path pre-distortion to the phase path using the inverse kernel;
  wherein the limiter and the mixer on the phase path comprise at least one mixer, at least one limiter, or both; and
  wherein the polar architecture comprises an amplitude path that comprises a supply modulator configured to modulate a voltage of an analog signal of the polar architecture.

22. The distortion correction circuitry of claim 21, comprising a calibration loopback configured to transmit one or more samples of a combined signal from the amplitude path and the phase path of the polar architecture to a calibration mixer of the distortion circuitry.

23. The distortion correction circuitry of claim 22, comprising the calibration mixer, configured to mix the one or more samples with a local oscillator signal and provided a calibration mixer output to a plurality of auxiliary analog to digital converters, wherein each of the plurality of auxiliary analog to digital converters is configured to down-convert the mixer output to a down-converted mixer output and provide the down-converted mixer output to calibration hardware.

24. The distortion correction circuitry of claim 23, comprising the calibration hardware configured to determine the inverse kernel based upon the down-converted mixer output, wherein the pre-distortion is based upon the inverse kernel.

25. A tangible, non-transitory, processor-readable medium, comprising processor-implemented instructions, configured to:
  receive a digital electrical signal of polar domain data via a polar architecture radio frequency system, wherein the polar architecture radio frequency system comprises an amplitude path that comprises a supply modulator configured to modulate a voltage of an amplitude path signal of the polar architecture radio frequency system; and
  introduce pre-distortion into the digital electrical signal, such that subsequent distortion on a phase path of the polar architecture radio frequency system, caused by a mixer and a limiter on the phase path, returns the digital electrical signal to its original form prior to the introduction of the pre-distortion, at least in part by:
    estimating coefficients of a forward kernel of the phase path by performing a regression on a mathematical representation of a transmitted phasor, wherein the forward kernel comprises a definition of the distortion on the phase path caused by the limiter and the mixer, the distortion on the phase path represented by a summation of unwanted phasors, wherein the unwanted phasors comprise intermodulated tones ($e^{j^A\theta}$ and $e^{j^{-A\theta}}$) each multiplied by a respective one of the coefficients of the forward kernel;
    estimating an inverse kernel of the forward kernel; and
    introducing a phase-path pre-distortion to the phase path using the inverse kernel.

26. The tangible, non-transitory, processor-readable medium of claim 25, comprising processor-implemented instructions, configured to:
  wirelessly transmit at least the digital electrical signal, via an antenna, after the digital electrical signal returns to its original form.

27. The tangible, non-transitory, processor-readable medium of claim 25, comprising processor-implemented instructions, configured to:
   determine the pre-distortion by:
   receiving one or more combined signals, comprising a combination of the amplitude path signal and the phase path signal;
   mixing, via the mixer, the one or more combined signals with a local oscillator signal and up-convert a resultant signal from a baseband frequency to a radio frequency (fFR) to obtain a calibration mixer output;
   amplify, via the limiter, the calibration mixer output to positive and negative rails;
   down-converting the calibration mixer output to obtain a down-converted calibration mixer output;
   estimating coefficients of the forward kernel of the phase path;
   determining, based upon the down-converted calibration mixer output, the inverse kernel of the forward kernel, wherein the inverse kernel is configured to invert phase path non-; and
   determining the pre-distortion based upon the inverse kernel.

28. An electronic device, comprising:
a radio frequency system comprising distortion correction logic configured to reduce distortions of a transmission signal caused by a mixer component and a limiter component on a phase path of a polar architecture of the radio frequency system, by:
determining a pre-distortion that will cause nonlinearities caused by the mixer component and the limiter component to result in a subsequent transmission signal that is a similar shape to the transmission signal prior to introduction of the pre-distortion of the transmission signal, by:
   estimating coefficients of a forward kernel of the phase path by performing a regression on a mathematical representation of a transmitted phasor, wherein the forward kernel comprises a definition of the distortion on the phase path caused by the limiter and the mixer, the distortion on the phase path represented by a summation of unwanted phasors, wherein the unwanted phasors comprise intermodulated tones ($e^{j4\theta}$ and $e^{-j4\theta}$) each multiplied by a respective one of the coefficients of the forward kernel;
   estimating an inverse kernel of the forward kernel; and
   defining the pre-distortion based upon the inverse kernel;
introducing the pre-distortion to the transmission signal, such that the distortions of the transmission signal caused by the mixer component and the limiter component on the phase path are counter-acted;
wherein the mixer component is configured to multiply a low frequency baseband signal (fBB) by a local oscillator signal and up-convert a resultant signal from baseband frequency to radio frequency (fRF);
wherein the limiter component is communicatively coupled to the at least one mixer and is configured to amplify the resultant signal after it is up-converted; and
wherein the radio frequency system comprises an amplitude path that comprises a supply modulator configured to modulate a voltage of an analog signal of the polar architecture.

29. The electronic device of claim 28, wherein the electronic device comprises a handheld electronic device, a tablet electronic device, a computer electronic device, or any combination thereof.

* * * * *